(12) United States Patent
Wang et al.

(10) Patent No.: US 12,032,179 B2
(45) Date of Patent: Jul. 9, 2024

(54) COLOR CONVERSION COMPONENT AND DISPLAY DEVICE

(71) Applicant: Chengdu Vistar Optoelectronics Co., Ltd., Sichuan (CN)

(72) Inventors: Tao Wang, Chengdu (CN); Yang Gu, Chengdu (CN); Bo Jiang, Chengdu (CN); Jingjing Li, Chengdu (CN); Chenggong Wang, Chengdu (CN)

(73) Assignee: CHENGDU VISTAR OPTOELECTRONICS CO., LTD., Sichuan (CN)

( * ) Notice: Subject to any disclaimer, the term of this patent is extended or adjusted under 35 U.S.C. 154(b) by 533 days.

(21) Appl. No.: 17/375,267

(22) Filed: Jul. 14, 2021

(65) Prior Publication Data

US 2021/0341653 A1    Nov. 4, 2021

Related U.S. Application Data

(63) Continuation of application No. PCT/CN2019/123306, filed on Dec. 5, 2019.

(30) Foreign Application Priority Data

Jun. 30, 2019    (CN) .......................... 201910581659.3

(51) Int. Cl.
*H01L 21/00*     (2006.01)
*G02B 5/02*      (2006.01)
(Continued)

(52) U.S. Cl.
CPC ......... *G02B 5/0215* (2013.01); *G02B 5/0816* (2013.01); *H01L 25/167* (2013.01)

(58) Field of Classification Search
CPC .............. G02B 5/02; G02B 5/08; H01L 25/16
See application file for complete search history.

(56) References Cited

U.S. PATENT DOCUMENTS

| 9,952,740 | B1 | 4/2018 | Kim et al. |
| 2004/0253413 | A1 | 12/2004 | Baba et al. |
| 2019/0181181 | A1* | 6/2019 | Yeon .................... H01L 25/0753 |

FOREIGN PATENT DOCUMENTS

| CN | 102005443 B | 2/2014 |
| CN | 105118928 A | 12/2015 |

(Continued)

OTHER PUBLICATIONS

International Search Report issued on Apr. 8, 2020 in corresponding International Application No. PCT/CN2019/123306; 12 pages.

(Continued)

*Primary Examiner* — Richard A Booth
(74) *Attorney, Agent, or Firm* — Maier & Maier, PLLC

(57) ABSTRACT

A color conversion component and a display device. The color conversion component includes a light conversion layer including a black matrix, color conversion layers and concave-convex structure layers; the black matrix has a plurality of through holes arranged in an array; the color conversion layers are located within at least a portion of the through holes and capable of emitting a light in a wavelength range different than that of an incident light; and the concave-convex structure layers are arranged at least correspondingly in each of the through holes accommodating the color conversion layers, and each concave-convex structure layer is located on a light incident side of the light conversion layer and has a concave-convex structure surface facing towards the respective color conversion layer.

19 Claims, 3 Drawing Sheets

(51) Int. Cl.
    G02B 5/08      (2006.01)
    H01L 25/16     (2023.01)

(56) References Cited

FOREIGN PATENT DOCUMENTS

| CN | 105794322 A | 7/2016 |
| CN | 106684108 A | 5/2017 |
| CN | 106773306 A | 5/2017 |
| CN | 107357080 A | 11/2017 |
| CN | 107731993 A | 2/2018 |
| CN | 108172608 A | 6/2018 |
| CN | 108257949 A | 7/2018 |
| CN | 108538875 A | 9/2018 |
| CN | 108573992 A | 9/2018 |
| CN | 109256455 A | 1/2019 |
| CN | 109256456 A | 1/2019 |
| CN | 109920813 A | 6/2019 |
| CN | 208953836 U | 6/2019 |
| EP | 3282310 A1 | 2/2018 |
| JP | 200439579 A | 2/2004 |
| JP | 2004258586 A | 9/2004 |
| KR | 20150051602 A | 5/2015 |

OTHER PUBLICATIONS

Office Action issued on May 31, 2022, in connection with corresponding Chinese Application No. 201910581659.3 (10 pp., including partial English translation).

* cited by examiner

A-A

COLOR CONVERSION COMPONENT AND DISPLAY DEVICE

CROSS REFERENCE TO RELATED APPLICATION

This application is a continuation of International Application No. PCT/CN2019/123306 filed on Dec. 5, 2019, which claims the priority benefits of Chinese Patent Application No. 201910581659.3 filed on Jun. 30, 2019 and entitled "COLOR CONVERSION COMPONENT AND DISPLAY DEVICE", both of which are incorporated herein by reference in their entireties.

TECHNICAL FIELD

The application relates to the field of display, and in particular to a color conversion component and a display device.

BACKGROUND

Micro-Light Emitting Diode (Micro-LED) technology may support the display of color patterns through a variety of color schemes, for example, by adding a light conversion layer. Although this measure can meet the requirement for colorization, the structure design of the existing light conversion layer is not reasonable, resulting in uneven light intensity distribution when the light emitted by the Micro-LED passes through the light conversion layer, which affects the display effect of the display device.

SUMMARY

Embodiments of the application provide a color conversion component and a display device, wherein the color conversion component can meet the requirements for color display of a display device while enabling uniform light intensity distribution and ensuring the display effect of the display device.

In one aspect, a color conversion component is proposed in accordance with embodiments of the application, which comprises a light conversion layer comprising a black matrix, color conversion layers and concave-convex structure layers; the black matrix has a plurality of through holes arranged in an array; the color conversion layers are located within at least a portion of the through holes and capable of emitting a light in a wavelength range different than that of an incident light; and the concave-convex structure layers are arranged at least correspondingly in each of the through holes accommodating the color conversion layers, and each concave-convex structure layer is located on a light incident side of the light conversion layer and has a concave-convex structure surface facing towards the respective color conversion layer.

In another aspect, a display device is proposed in accordance with embodiments of the application, which comprises a back plate component comprising a drive back plate and a light emitting layer arranged on the drive back plate, the light emitting layer comprising a plurality of light emitting units distributed in an array and a retaining wall, by which the adjacent light emitting units being separated from each other; the aforesaid color conversion component, the color conversion component being stacked and abutted against the back plate component in a thickness direction of the light conversion layer, each of the light emitting units being arranged opposite to the through holes in the black matrix of the color conversion component in the thickness direction respectively.

In the color conversion component and the display device provided according to embodiments of the application, the color conversion component comprises a light conversion layer, and since the light conversion layer comprises a black matrix, color conversion layers and concave-convex structure layers, it is possible to emit a light in a wavelength range different than that of the incident light by the color conversion layers, so as to meet the full-color display requirement of the display device. Meanwhile, the concave-convex structure layers arranged in a corresponding way can diffuse the lights, thereby enabling uniform intensity distribution of the lights and ensuring the display effect of the display device.

BRIEF DESCRIPTION OF THE DRAWINGS

The features, advantages and technical effects of the exemplary embodiments of the application will be described below with reference to the drawings.

DETAILED DESCRIPTION

The features and embodiments of the application in various aspects will be described in detail below. For clearly understanding of the purpose, technical solution and advantages of the application, the application will be described in further details in combination with the drawings and specific embodiments. It should be noted that the specific embodiments described herein are configured to explain the application rather than to limit it. A person skilled in the art may implement the application without some of these specific details. The following description of the embodiments is for the purpose of better understanding of the application through showing examples of the application.

For better understanding of the application, the color conversion component and the display device according to the embodiments of the application will be described below in detail in combination with FIGS. 1 to 6.

Figure 1:
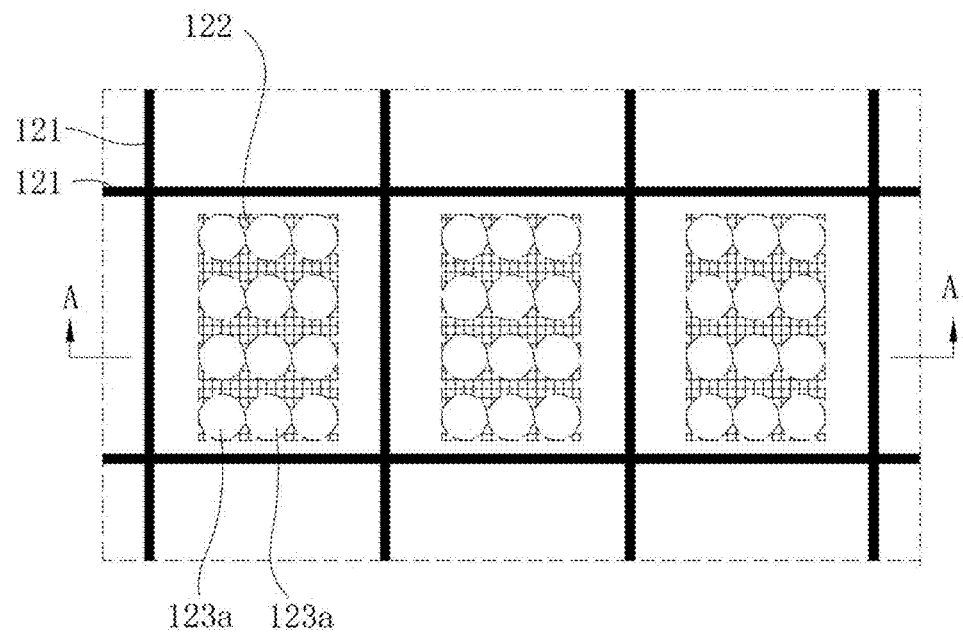
FIG. 1 is a schematic structural top view of a display panel of an embodiment of the application.
Figure 2:
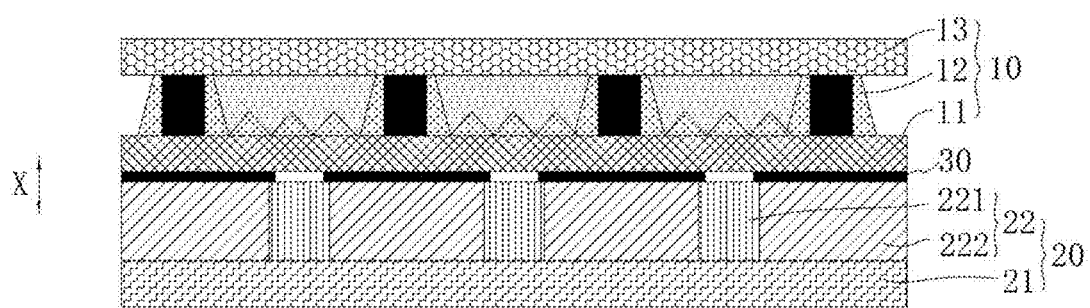
FIG. 2 is a schematic structural cross-sectional view of a display panel of an embodiment of the application.

Please refer to FIGS. 1 and 2. FIG. 1 shows a schematic structural top view of a display device of an embodiment of the application, and FIG. 2 shows a schematic structural cross-sectional view of a display device of an embodiment of the application.

An embodiment of the application provides a display device comprising a back plate component 20 and a color conversion component 10. The back plate component 20 comprises a drive back plate 21 and a light emitting layer 22 arranged on the drive back plate 21. The light emitting layer 22 comprises a plurality of light emitting units 221 arranged in an array and a retaining wall 222, by which the adjacent light emitting units 221 are separated from each other. The color conversion component 10 and the back plate component 20 are stacked and abutted against each other.

Optionally, the drive back plate 21 of the back plate component 20 may comprise a substrate base and a drive circuit arranged on the substrate base. The drive circuit may in particular comprise an active drive circuit and/or a passive drive circuit.

The retaining wall 222 comprised in the light emitting layer 22 may be made of an organic material, such as Cardo resin, polyimide resin, or acrylic resin, for improving the flatness of the surface of the back plate to facilitate connection with the color conversion component 10. The retaining wall 222 defines a plurality of accommodation portions, which may optionally be of a rectangular configuration. The height of the retaining wall 222 on the drive back plate 21 may be greater than or equal to that of the light emitting unit 221 the drive back plate 21.

A plurality of light emitting units 221 distributed in an array may be arranged in the accommodation portions and electrically connected to drive circuits respectively, by which respective light emitting unit 221 is controlled. With the retaining wall 222 arranged between the adjacent light emitting units 221, it is possible to prevent the lights emitted from the light emitting units 221 from interference with each other.

The light emitting units 221 may be micro light emitting diode chips. In some optional examples, each of the light emitting units 221 may be a blue light micro light emitting diode chip, and each accommodation portion may be provided with one light emitting unit 221 therein. Of course, two or more light emitting units 221 may be provided depending on the size ratio of the accommodation portion to the light emitting unit 221, which is not particularly limited herein. In order to facilitate the arrangement of the color conversion component 10, optionally, a side of the light emitting layer 22 away from the drive back plate 21 is planarized such that the light emitting layer 22 has a planarized surface.

Optionally, the color conversion component 10 is located over the planarized surface of the light emitting layer 22. In order to enable the display device to accomplish full-color display while enabling uniform light intensity distribution and ensuring the display effect of the display device, optionally, embodiments of the application further provide a color conversion component 10, which may be separately produced, sold, etc. as a separate member. Of course, it may also be used in the display device of each of the above embodiments and function as a constituent part of the display devices of the above various embodiments.

For better understanding of the color conversion component 10 provided by the embodiments of the application, the color conversion component 10 will be described in detail below in conjunction with FIGS. 3 to 6.

Figure 3:
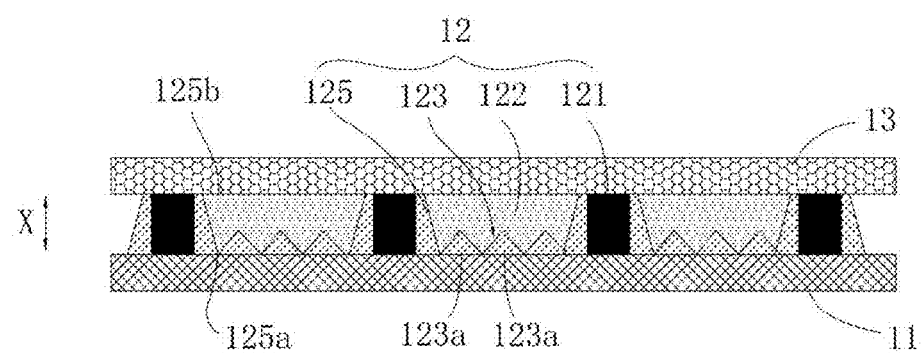
FIG. 3 is a schematic structural cross-sectional view of a color conversion component of an embodiment of the application.

Please also refer to FIG. 3, which is a schematic cross-sectional view of the color conversion component 10 according to an embodiment of the application. The color conversion component 10 provided by the embodiment of the application comprises a light conversion layer 12. The light conversion layer 12 comprises a black matrix (BM) 121, color conversion layers 122, and concave-convex structure layers 123.

The black matrix 121 has a plurality of through holes arranged in an array. The black matrix 121 may be made of a black light absorbing material and may be a black pigment or a colorant of a dye. In some embodiments, the material for the black matrix 121 is, for example, titanium black, lignin black, composite oxide pigment such as iron or manganese, combination of the above pigments, and the like. By providing the black matrix 121, mutual interference of lights passing through different through holes can be avoided.

The color conversion layers 122 are located at least within a portion of the through holes. And the color conversion layers 122 can emit light having a wavelength range different from that of an incident light. The concave-convex structure layers 123 are arranged at least correspondingly in each through hole accommodating a color conversion layer 122. Each concave-convex structure layer is located on a light incident side of the light conversion layer 122 and has a concave-concave structure surface facing towards the respective color conversion layer 122.

When the color conversion component 10 provided by the embodiments of the application is applied to a display device, the color conversion component 10 is stacked with the back plate component 20 in a thickness direction X of the light conversion layer 12, and, each of the light emitting units 221 is arranged corresponding to the respective through hole in the black matrix 121 of the color conversion component 10 respectively. The lights emitted from the light emitting units 221 can function as the incident lights of the color conversion component 10, and the lights emitted from at least a portion of light emitting units 221 are converted into lights in a different wavelength range by the color conversion layers 122, thereby meeting the requirement for full-color display of the display device. Meanwhile, the concave-convex structure layers 123 arranged in a corresponding way can diffuse the lights, such that the lights can be uniformly distributed after passing through the light conversion layer, thereby enabling uniform intensity distribution of the lights and ensuring the display effect of the display device.

As an optional implementation, when employing blue light micro light emitting diode chips as the light emitting units 221, in order to satisfy the full-color display of the display device, the color conversion layer 122 may comprise a red conversion unit and a green conversion unit distributed in an array. The red conversion unit converts the light of its corresponding light emitting unit 221 into a red sub-pixel. The green conversion unit converts the light of its corresponding light emitting unit 221 into a green sub-pixel. The color conversion units may not be provided or transparent color conversion units may be provided over the remaining portion of the light emitting units 221 to maintain the original color of the light emitting units 221 and form blue sub-pixels, in order to ensure that the display device can accomplish full-color display.

In some optional examples, the red conversion unit comprises a photoluminescent material for generating a red light, for example, a material formed by mixing a red quantum dot with photoresist or by mixing a material in which a red organic photoluminescent material with photoresist. In some optional examples, the green conversion unit comprises a photoluminescent material for generating a green light, for example, a material formed by mixing a green quantum dot with photoresist or by mixing a material in which a green organic photoluminescent material with photoresist. Wherein the photoresist is negative glue and the quantum dot layer is a quantum dot material capable of forming a specific excitation wavelength, comprising but not limited to a shell made of zinc sulfide (ZnS), and may be one or more of cadmium selenide (CdSe), cadmium telluride (CdTe), cadmium sulfide (CdS), indium phosphide (InP) and perovskite. The quantum dot material also comprises a scatterer, such as titanium oxide, or silicon dioxide, etc.

When the color conversion layer 122 comprises a transparent conversion unit, optionally, the transparent conversion unit comprises a transparent material such as transparent photoresist, transparent polymer (such as poly methyl meth acrylate, PMMA) and the like. It is to be appreciated that the transparent conversion unit is not required to convert the blue light emitted from the blue light micro light emitting diode, but is used for the blue lights emitted by the blue microlight emitting diode to directly pass through.

In some optional examples, a concave-convex structure layer may be provided in each through hole. By the above arrangement, the incident light passing through each through hole of the color conversion component 10 can be diffused to satisfy the uniformity requirement of light intensity distribution for the display device better.

As an optional implementation, each of the concave-convex structure layers is arranged in the same layer. By arrangement of each of the concave-convex structure layers in the same layer, the uniformity of light intensity distribution can be ensured better while each concave-convex structure surface can be simultaneously manufactured and formed, such that the forming process of the color conversion component 10 is simplified in order to save production time and to increase production efficiency.

In some optional embodiments, the light conversion layer 12 may further comprise a barrier layer 125 formed on an inner wall of the respective through hole. The forming of the color conversion layer 122 may be better satisfied by providing the barrier layer 125.

In some optional embodiments, the barrier layer 125 located inside the respective through hole is looped to form an orifice. Optionally, the orifice formed in each through hole may be arranged coaxially with that through hole. The orifice has a first opening 125a and a second opening 125b opposite to the first opening. The second opening 125b has a size larger than that of the first opening 125a. The concave-convex structure layer 123 is arranged close to the respective first opening 125a, and the color conversion layer 122 is arranged within the respective orifice. By defining the orifice encircled and formed by the barrier layer 125 in the above structural type, a light entering the orifice from the first opening 125a may be emitted out of the second opening 125b in a collimated manner, thereby improving the display effect. In the application, the concave-convex structure layer 123 is arranged close to the respective first opening 125a refers to a distance between the concave-convex structure layer 123 and the first opening 125a is smaller than that between the concave-convex structure layer 123 and the second opening 125b.

As an optional implementation, the material of the barrier layer 125 may be the same as that of the concave-convex structure layer 123, thereby accomplishing the connection between the concave-convex structure layer 123 and the barrier layer 125 better and ensuring the limiting effect of the color conversion layer 122 better.

In some optional embodiments, the barrier layer 125 may be formed integrally with the respective concave-convex structure layer 123. The forming process of the color conversion component may be simplified, and the display effect of the display device may be further optimized. In an optional implementation, a complete barrier material layer may be formed at first in the actual manufacturing process. A first groove with a concave-convex structure surface and a second groove for accommodating the black matrix are formed in the barrier material layer by impressing process. Then a black matrix material is filled in the second groove, so as to accomplish the integral formation of the barrier layer 125 and the concave-convex structure layer 123. Of course, in some other examples, the black matrix with through holes may be formed at first, and the through holes are filled with barriers. Then the barrier layer 125 and the concave-convex structure layer 123 are integrally formed by impressing.

As an optional implementation, a width-to-thickness ratio of the black matrix 121 between two adjacent through holes is 2. For example, the black matrix 121 has a width of 5 um and the depth may 10 um. Compared to the structure form of the black matrix 121 in the prior arts, there is an advantage that the light barrier effect can be ensured without affecting the resolution of the display device.

As an optional implementation, the concave-convex structural surface has a protrusion 123a extending in a thickness direction of the light conversion layer. With the above arrangement, the light emitted from the light emitting unit 221 may pass through the protrusion 123a and be scattered to the periphery of the protrusion 123a in order to overcome the defect that the light emission of the micro light emitting diode is generally strong in the middle and weak in the periphery and ensure the uniformity of light intensity after conversion by the light conversion layer 12.

Optionally, the amount of the protrusions 123a comprised in each concave-convex structural surface may be one, and when the amount is one, it may be located in or near the middle of the corresponding through hole. Of course, the amount of the protrusions 123a comprised in each concave-convex structure surface may be plural, and when the amount is plural, the plurality of projections 123a may be distributed in rows and columns. With the above arrangement, the light intensity surrounding the periphery of the light emitting unit 221 after the light is emitted can be enhanced, so as to ensure the uniformity of light intensity of the display device to which the color conversion component is applied such that it has a better display effect.

Referring to FIG. 3, as an optional implementation, the cross section of the protrusion 123a comprised in the concave-convex structure surface in the thickness direction X of the light conversion layer 12 may be a polygon, such as a triangle, a rectangle, or a trapezoid. That is, the protrusions 123a may be of a conical shape, a cylindrical shape, or a frustum shape. The projections 123a of the concave-convex structure surface in the above structural form can diffuse the light emitted from the light emitting unit 221 to form a uniform light re-excitation color conversion layer 122, thereby achieving uniformly distribution of the light emitting units 221 after color conversion by the color conversion layer 122.

Figure 4:
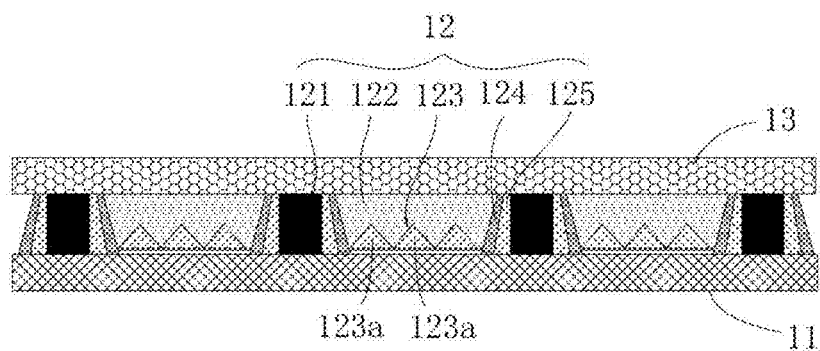
FIG. 4 is a schematic structural cross-sectional view of the color conversion component shown in FIG. 3 provided with an additional reflective layer.

Also referring to FIG. 4, the light conversion layer 12 of the color conversion device 10 provided by each of the above embodiments may further comprise a reflective layer 124. The reflective layer 124 is arranged on the inner wall of the through hole and surrounds the concave-convex structure surface. By providing the reflective layer 124, the problem of light interference between adjacent sub-pixels can be prevented while the light after color conversion by the light conversion layer 12 can be reflected, so as to improve the light emitting efficiency of the light conversion layer 12.

The color conversion component 10 may further comprise first distributed Bragg reflection films arranged in one-to-one correspondence with each of the through holes. The first distributed Bragg reflection film is located on a side of the respective color conversion layer 122 facing towards the concave-convex structure layer 123, and is configured to allow transmission of a light in the same wavelength range as the incident light.

With the above arrangement, an incident light, such as the light emitted from the light emitting unit 221, is incident upon the color conversion layer 122 through the first distributed Bragg reflection film and the concave-convex structure layer 123 in sequence when emitted to the color conversion component 10.

Each first distributed Bragg reflection film may be formed by stacking two films having a higher refractive index and a lower refractive index respectively. The combination of the two films comprises, but is not limited to, a $TiO_2$ film and an $Al_2O_3$ film, a $TiO_2$ film and a $SiO_2$ film, and a $Ta_2O_5$ film and an $Al_2O_3$ film, a $HfO_2$ film and a $SiO_2$ film, in each combination of which the former is the film of the higher refractive index and the latter is the film of the lower refractive index.

In some embodiments, the first distributed Bragg reflection films are further configured to reflect a light in at least one other wavelength range at the same time.

Each first distributed Bragg reflection films is located at the light incident side of the respective concave-convex structure layer 123, that is, between the back plate component 20 and the color conversion layer 122. Optionally, the first distributed Bragg reflection films may be arranged within the respective through holes, and of course, may also be arranged outside and opposite to the respective through holes.

The first distributed Bragg reflection film allow a light emitted from the light emitting unit 221 to enter the respective through hole and reflects a light of another color converted in the through hole, such that all the converted lights are emitted towards the light exiting side opposite to the back plate component 20, so as to improve the utilization rate of the light energy.

In some embodiments, that color conversion component may further comprise second distributed Bragg reflection films arranged in correspondence with the color conversion layers 122. The second distributed Bragg reflection film is located on a side of the respective color conversion layer 122 facing away from the concave-convex structure layer 123, and is configured to allow transmission of the light emitted by the color conversion layer 122 in the corresponding through hole.

Each second distributed Bragg reflection film may be formed by stacking two films having a higher refractive index and a lower refractive index respectively. The combination of the two films comprises, but is not limited to, a $TiO_2$ film and an $Al_2O_3$ film, a $TiO_2$ film and a $SiO_2$ film, and a $Ta_2O_5$ film and an $Al_2O_3$ film, a $HfO_2$ film and a $SiO_2$ film, in each combination of which the former is the film of the higher refractive index and the latter is the film of the lower refractive index.

The second distributed Bragg reflection films are configured to allow transmission of the lights emitted by the color conversion layers 122 in the corresponding through holes. In some embodiments, the second distributed Bragg reflection films are further configured to reflect a light in at least one other wavelength range at the same time. In some embodiments, the second distributed Bragg reflect films may be configured to reflect lights in the same wavelength range as the incident lights, such that incident lights which are not absorbed by the color conversion layers 122 are reflected to the color conversion layers 122 again for excitation conversion.

The second distributed Bragg reflection film is located on a side of the respective color conversion layer 122 facing away from the concave-convex structure layer 123, i.e., in some embodiments, the side closer to the outgoing light in the color conversion assembly 10. Again, the second distributed Bragg reflection film may be located within or outside the respective through hole. The second distributed Bragg reflection films allow transmission of the lights emitted by the color conversion layers 122 in the corresponding through holes and reflect lights in at least one other wavelength range, such that the purity of the lights emitted by the corresponding through holes is higher, and when the incident lights are reflected by the second distributed Bragg reflection films, the utilization ratio of light energy can also be improved.

The color conversion component 10 provided by the above embodiments may further comprise a first substrate 11 located at one side of the light conversion layer 12 in the thickness direction X. Optionally, the color conversion component 10 may further comprise a second substrate 13 arranged opposite to the first substrate 11, which may be located on the other side of the light conversion layer 12 in the thickness direction X.

Optionally, each of the first substrate 11 and the second substrate 13 may be a colorized substrate, and the material thereof may be glass or a polymer material, such as polycarbonate, polyvinyl chloride, polyester, acrylic, or the like. With the above arrangement, it is possible to further facilitate the forming of the light conversion layer 12 while facilitating the connection between the color conversion component 10 and the corresponding parts of a display device when applied to the display device.

Figure 5:
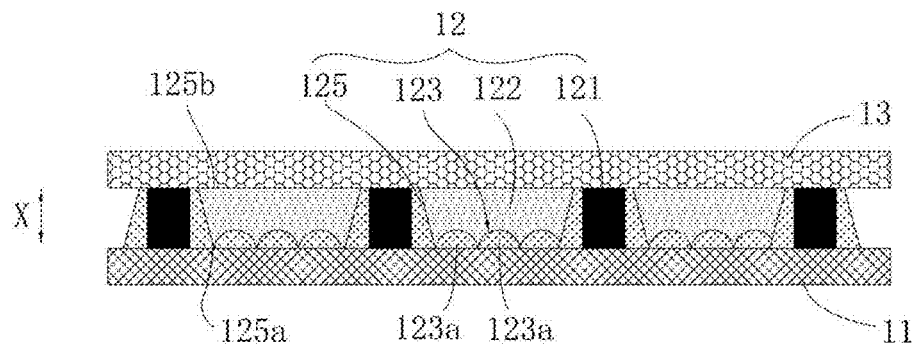
FIG. 5 is a schematic structural cross-sectional view of a raised cross section and the color conversion component different from that of FIG. 3.

Referring to FIG. 5, in each of the above embodiments, the cross section of the protrusion 123a of the concave-convex structure surface of the light conversion layer 12 in the thickness direction X is illustrated as a polygon, which is an optional manner, but not limited thereto. In some other examples, the cross section of the protrusions 123a of the light-converting layer 12 in the thickness direction X may also be an arc, which may be a circular arc or an elliptical arc, either a superior arc or a inferior arc. Correspondingly, the structural shape of each protrusion 123a may also be a partial structure of a sphere or ellipsoid, and the color conversion module 10 in the above structural form can also meets the requirement of the display device for the uniformity of light intensity distribution.

Figure 6:
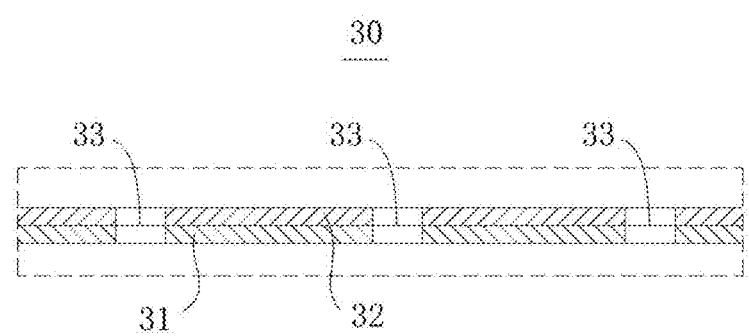
FIG. 6 is a partial cross-sectional view of a baffle component of an embodiment of the application.

Please also refer to FIGS. 2 and 6, in which FIG. 6 shows a partial cross-sectional view of the baffle component 30 of an embodiment of the application. The display device provided by the above various embodiments further comprises a baffle component 30 arranged between the back plate component 20 and the color conversion component 10. The baffle component 30 is provided with a light transmission hole 33 at the position corresponding to each light emitting unit 221.

The baffle component 30 comprises a first baffle layer 31 and a second baffle layer 32 laminated in the thickness direction X. The first baffle 31 is located between the back plate component 20 and the second baffle layer 32. Optionally, the first barrier layer 31 is made of a black light absorbing material and may be for example a black pigment or a colorant of a dye. It may be titanium black, lignin black, composite oxide pigment such as iron/manganese, combination of the above pigments, and the like, for blocking a light emitted from the light emitting unit 221 below, thereby reducing interference between pixels.

The second barrier layer 32 is made of a light reflecting material. Since the light emission of the quantum dot material is omni-directional, the light beam emitted from the colorized film can be reflected when the light propagates to the second barrier layer 32, thereby improving the light emitting efficiency of the colorized film. The reflecting material may be silver, aluminum, or the like, for reflecting the light from the color conversion layer 122 above, which is advantageous for improving the light emitting efficiency of the color conversion component 10.

In each of the above embodiments, the light emitting unit 221 is a blue light micro light emitting diode chip, which is an optional manner. In some other examples, the light emitting unit 221 may also employ an ultraviolet light micro light emitting diode. In this case, a color conversion layer is located in each through hole, and the color conversion layer comprises a red conversion unit, a green conversion unit and a blue conversion unit, which is also possible to meet the colorized display requirement of the display device.

In conclusion, in the color conversion component 10 provided by the embodiment of the application, since it comprises a light conversion layer 12 which comprises a black matrix 121, color conversion layers 122, and concave-convex structure layers 123, it is possible to emit lights in a wavelength range different than that of the incident lights by the color conversion layers 122, so as to meet the full-color display requirement of the display device. Meanwhile, the concave-convex structure layers 123 arranged in a corresponding way can diffuse the lights, such that the lights can be uniformly distributed after passing through the light conversion unit, thereby enabling uniform intensity distribution of the lights and ensuring the display effect of the display device.

In the display device provided by the embodiments of the application, since it comprises the color conversion component 10 of the above embodiments, such that the light intensity of the lights passing through the color conversion component 10 is uniform, and the correspondingly arranged baffle component 30 can further avoid the interference of the lights between the sub-pixels while improving the light emitting efficiency, such that the display device as a whole has a better display effect, which is easy to popularize and use.

Although the application has been described in reference to preferred embodiments, the various technical features mentioned in various embodiments can be combined in any way without departing from the scope of the application and in particular, as long as there is no structural conflict. The application is not limited to the specific embodiments disclosed herein, but comprises all the technical solutions which fall into the scope of the claims.

What is claimed is:

1. A color conversion component comprising:
    a light conversion layer comprising
        a black matrix, wherein the black matrix has a plurality of through holes arranged in an array;
        color conversion layers, wherein the color conversion layers are located within the through holes and are configured to emit a light having a wavelength range different from a wavelength range of incident light;
        concave-convex structure layers, wherein the concave-convex structure layers are arranged at least correspondingly in each of the through holes accommodating the color conversion layers, and each layer of the concave-convex structure layers is located on a light incident side of the light conversion layer and has a concave-convex structure surface facing towards the respective color conversion layer; and
    a barrier layer formed on an inner wall of the respective through hole.

2. The color conversion component according to claim 1, wherein each of the through holes is provided with the respective concave-convex structure layer therein.

3. The color conversion component according to claim 2, wherein the concave-convex structure layers are arranged in the same layer.

4. The color conversion component according to claim 1, wherein a material of the barrier layer is the same as a material of the respective concave-convex structure layer.

5. The color conversion component according to claim 1, wherein the barrier layer is formed integrally with the respective concave-convex structure layer.

6. The color conversion component according to claim 1, wherein the barrier layer located inside the respective through hole is looped to form an orifice in which the respective color conversion layer is arranged, the orifice having a first opening and a second opening opposite to the first opening-, the second opening having a size larger than that of the first opening, a distance between the concave-convex structure layer and the first opening being smaller than a distance between the concave-convex structure layer and the second opening.

7. The color conversion component according to claim 1, wherein the concave-convex structure surface has a protrusion extending in a thickness direction of the light conversion layer.

8. The color conversion component according to claim 7, wherein the cross section of the protrusion in the thickness direction of the light conversion layer is an arc or a polygon.

9. The color conversion component according to claim 7, wherein each concave-convex structure surface comprises a plurality of protrusions arranged in rows and columns respectively.

10. The color conversion component according to claim 7, wherein each concave-convex structure surface comprises one protrusion located in the middle of the respective through hole.

11. The color conversion component according to claim 1, wherein a width-to-thickness ratio of the black matrix between two adjacent through holes is 2.

12. The color conversion component according to claim 1, wherein the light conversion layer further comprises:
    a reflective layer arranged on an inner wall of the respective through hole and surrounding the respective concave-convex structure surface.

13. The color conversion component according to claim 1, wherein the color conversion component further comprises:
    first distributed Bragg reflection films arranged in one-to-one correspondence with each of the through holes, the first distributed Bragg reflection films being located on the light incident sides of the respective concave-convex structure layers, the first distributed Bragg reflection films being configured to allow transmission of the lights in the same wavelength range as the incident lights; and/or second distributed Bragg reflection films arranged in one-to-one correspondence with the color conversion layers, the second distributed Bragg reflection films being located on sides of the color conversion layers facing away from the concave-convex structure layers, the second distributed Bragg reflection films being configured to allow transmission of the lights emitted by the color conversion layers in the corresponding through holes.

14. The color conversion component according to claim 1, wherein the color conversion component further comprises:

a first substrate located at a side of the light conversion layer in a thickness direction thereof and connected to the light conversion layer;

a second substrate arranged opposite to the first substrate, the second substrate being located on the other side of the light conversion layer in the thickness direction thereof and connected to the light conversion layer.

15. The color conversion component according to claim 14, wherein the first substrate and the second substrate are colorized substrates respectively.

16. A display device comprising:

a back plate component comprising a drive back plate and a light emitting layer arranged on the drive back plate, the light emitting layer comprising a plurality of light emitting units distributed in an array and a retaining wall, by which the adjacent light emitting units being separated from each other; and a color conversion component according to claim 1, the color conversion component being stacked and abutted against the back plate component in a thickness direction of the light conversion layer, each of the light emitting units being arranged corresponding to the respective through holes of the color conversion component in the thickness direction respectively.

17. The display device according to claim 16, further comprising:

a baffle component arranged between the back plate component and the color conversion component, the baffle component being provided with a light transmission hole at the position corresponding to each of the light emitting units.

18. The display device according to claim 17, wherein the barrier component further comprises:

a first barrier layer and a second barrier layer laminated in the thickness direction, the first baffle layer being located between the back plate component and the second baffle layer, the first barrier layer being made of a black light absorbing material, the second barrier layer being made of a light reflecting material.

19. The display device according to claim 16, wherein the light emitting units are blue light micro light emitting diode chips or ultraviolet micro light emitting diodes.

* * * * *